United States Patent
Liu et al.

(10) Patent No.: US 10,826,473 B2
(45) Date of Patent: Nov. 3, 2020

(54) PVT-INDEPENDENT FIXED DELAY CIRCUIT

(71) Applicant: Integrated Silicon Solution, Inc. Beijing, Beijing (CN)

(72) Inventors: Weikang Liu, Beijing (CN); Chia Yu Lin, Beijing (CN)

(73) Assignee: INTEGRATED SILICON SOLUTION, INC. BEIJING, Beijing (CN)

( * ) Notice: Subject to any disclaimer, the term of this patent is extended or adjusted under 35 U.S.C. 154(b) by 0 days.

(21) Appl. No.: 16/703,867

(22) Filed: Dec. 5, 2019

(65) Prior Publication Data

US 2020/0186134 A1    Jun. 11, 2020

(30) Foreign Application Priority Data

Dec. 5, 2018 (CN) .......................... 2018 2 2032119

(51) Int. Cl.
*H03K 5/133* (2014.01)
*H03K 5/00* (2006.01)

(52) U.S. Cl.
CPC ..... *H03K 5/133* (2013.01); *H03K 2005/0013* (2013.01); *H03K 2005/00143* (2013.01); *H03K 2005/00202* (2013.01)

(58) Field of Classification Search
CPC ..................................................... H03K 5/133
See application file for complete search history.

(56) References Cited

U.S. PATENT DOCUMENTS

| | | | | |
|---|---|---|---|---|
| 5,926,062 | A * | 7/1999 | Kuroda | G05F 3/265 323/315 |
| 10,348,534 | B1 * | 7/2019 | Sreeramaneni | H04L 25/021 |
| 2005/0206466 | A1 * | 9/2005 | Sohn | H03K 3/011 331/185 |
| 2006/0181324 | A1 * | 8/2006 | Dreps | H03K 5/133 327/276 |
| 2007/0070720 | A1 * | 3/2007 | Lee | G11C 5/14 365/189.09 |
| 2007/0103209 | A1 * | 5/2007 | Lee | G11C 7/1084 327/112 |
| 2007/0139081 | A1 * | 6/2007 | Lee | G11C 7/22 326/93 |
| 2007/0247931 | A1 * | 10/2007 | Kim | G11C 5/147 365/189.09 |
| 2008/0018320 | A1 * | 1/2008 | Jongsma | G05F 3/262 323/315 |
| 2009/0085550 | A1 * | 4/2009 | Ide | G05F 3/16 323/315 |
| 2009/0167368 | A1 * | 7/2009 | Chan | H03K 19/00361 327/108 |
| 2010/0214032 | A1 * | 8/2010 | Hinrichs | H03F 3/45659 331/57 |

(Continued)

*Primary Examiner* — Adam D Houston
(74) *Attorney, Agent, or Firm* — Leong C. Lei (57) ABSTRACT

A PVT-independent fixed delay circuit includes a circuit structure that has a current generator and a multi-level inverter-based time delay unit. The inverter-based time delay unit has at least two NMOS transistors M5, M6, and at least two PMOS transistors M7, M8. The current generator has a circuit structure including at least two NMOS transistors M1, M2, at least two PMOS transistors M3, M4 and a resistor $R_S$.

3 Claims, 6 Drawing Sheets

(56) References Cited

U.S. PATENT DOCUMENTS

| | | | |
|---|---|---|---|
| 2012/0306554 A1* | 12/2012 | Ma | H03K 5/01 |
| | | | 327/165 |
| 2016/0266598 A1* | 9/2016 | Wong | G05F 3/267 |
| 2018/0267480 A1* | 9/2018 | Mahajan | G06F 1/12 |
| 2019/0028089 A1* | 1/2019 | R R | H03K 3/012 |
| 2019/0171246 A1* | 6/2019 | Chu | G05F 3/30 |
| 2019/0181845 A1* | 6/2019 | Khare | H03L 7/104 |
| 2019/0372575 A1* | 12/2019 | Wu | H03H 7/06 |
| 2020/0186134 A1* | 6/2020 | Liu | H03K 5/133 |

* cited by examiner

PVT-INDEPENDENT FIXED DELAY CIRCUIT

BACKGROUND OF THE INVENTION

1. Technical Field

The present invention relates to the field of electronics, and more particularly to a PVT-independent fixed delay circuit.

2. Description of Related Art

Figure 1:
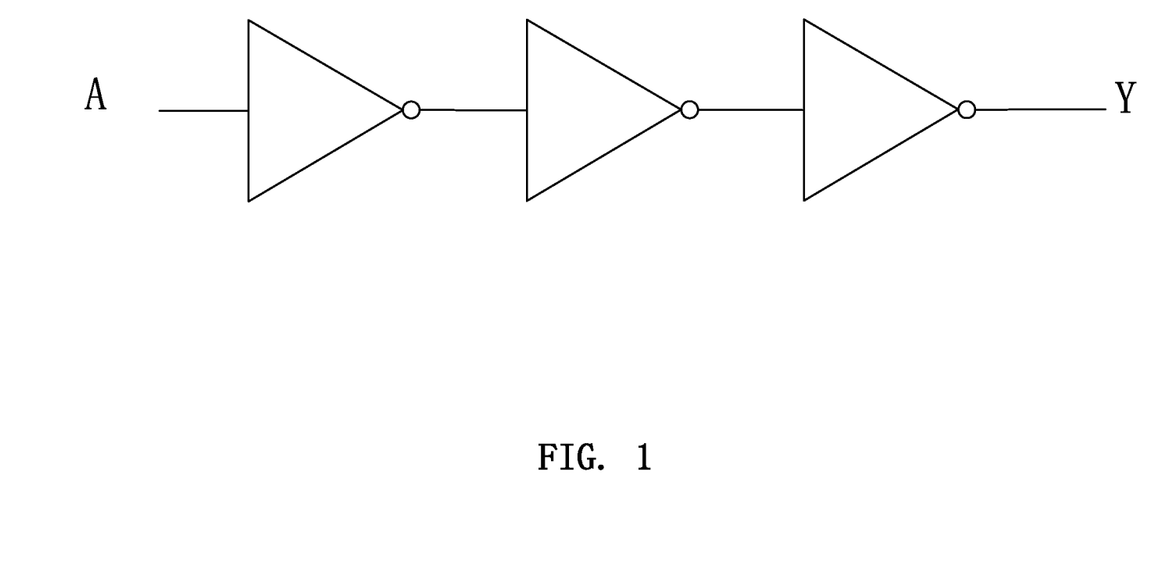
FIG. 1 is a cascade circuit diagram of an existing inverter-based time delay unit.

FIG. 1 shows a time delay chain composed of inverters. Connecting inverters serially is a common practice to provide time delay in design of digital circuits (typically having an even number of levels) for delaying signals in terms of timing. However, such a design makes the resulting inverter-based unit undesirably sensitive to variations of the voltage, temperature and process of the connected power source. Upon changes in the voltage, temperature and/or process of a power source, significant variations can be seen in a delay circuit serially connected to the inverters. For a circuit requires high precision in terms of delay, the foregoing scheme of connecting inverters in series can lead to huge offsets, eventually degrading the accuracy and stability of the circuit.

Figure 2:
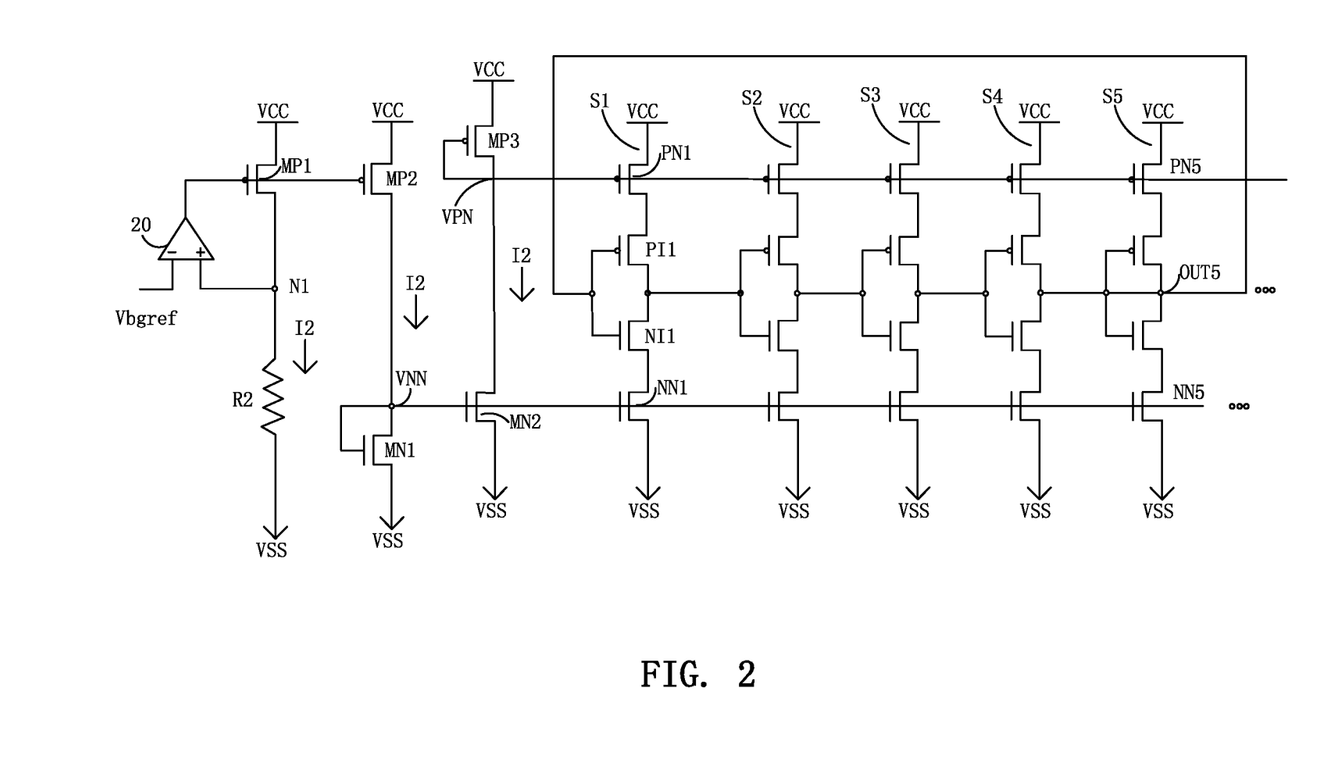
FIG. 2 is a circuit diagram of an existing current generator controlled by a bandgap reference voltage.

FIG. 2 shows an existing approach to PVT-independent fixed delay disclosed in U.S. Pat. No. 7,391,274 B2, which is a delay chain made of time delay units controlled by a bandgap reference voltage circuit. As shown in FIG. 2, use of the operational amplifier, the bandgap reference circuit and the special material resistor allows the gate voltage at the nodes N1 and MP1 to remain stable despite changes in temperature and process, thereby securing stableness of the current I2 (assuming that there is not a temperature coefficient of the special material). As a 1:1 mapping result of this, the delay in the current of the inverters is relatively constant and independent of temperature variations. However, this approach needs a bandgap reference voltage independent of temperature and an operational amplifier that fixes the voltage at nodes in the current generator, while requiring a resistor made of a special material that provides the reference current that is independent of temperature. Besides, the inverter-based time delay unit so constructed is still dependent on temperature and voltage. For example, as temperature changes, the mobility of the charge carriers of the MOS PN1 and MOS NN1 in the inverters decreases (due to the increased equivalent resistance that weakens the metal-oxide semiconductors). Even if the current generator holds a stable current, the delay provided by the serially connected inverters can slow down as temperature increases, leading to longer delay time. In addition, variations in the source voltage can have impacts on delay of a time delay unit of inverters.

SUMMARY OF THE INVENTION

In view of the shortcomings of the prior art, the primary object of the present invention is to provide a PVT-independent fixed delay circuit, which maintains constant delay time independent of variations of ambient temperature and power source voltage. The disclosed circuit uses a current generator circuit independent of the power source voltage to generate two reference voltages (all the MOSes working in a saturated state), which are connected into the upper-end PMOS transistor M8 and the lower-end NMOS transistor M5 of the inverter-based time delay unit, respectively, to control the charging and discharging currents of the inverters, and uses correlative compensation to secure a stable delay circuit.

To achieve the foregoing objective, the present invention implements the following technical scheme:

a PVT-independent fixed delay circuit, comprising a current generator and an inverter-based time delay unit, the inverter-based time delay unit comprising at least two NMOS transistors M5, M6 and at least two PMOS transistors M7, M8, wherein a power source VDD is first input to a source of the PMOS transistor M8, in a sequence of the PMOS transistor M8, the PMOS transistor M7, the NMOS transistor M6 and then the NMOS transistor M5, with drains and sources of the adjacent same-type transistors strung together, and at last is grounded through the source of the NMOS transistor M5, in which a gate of the PMOS transistor M8 is connected to a lead PBIAS; a gate of the PMOS transistor M7 and a gate of the NMOS transistor M6 are connected to each other to act as an input A; the drain of the PMOS transistor M7 and the drain of the NMOS transistor M6 are both connected to an output Y; and a gate of the NMOS transistor M5 is connected to a lead NBIAS; and the current generator having a circuit structure including at least two NMOS transistors M1, M2, at least two PMOS transistors M3, M4 and a resistor $R_S$, wherein the power source VDD is first input to sources of the PMOS transistors M3, M4, gates of the PMOS transistor M3, M4 and a drain of the M4 electrically connected together to act as an output of the lead PBIAS, drains of the PMOS transistors M3, M4 being connected to drains of the NMOS transistors M1, M2, respectively, gates of the NMOS transistors M1, M2 and a drain of the M1 being electrically connected together to act as an NBIAS output, a source of the NMOS transistor M1 being directly grounded, a source of the NMOS transistor M2 being connected to the resistor $R_S$, and then an opposite end of the resistor $R_S$ being grounded;

wherein, the outputs of the leads PBIAS and NBIAS in the current generator are to be connected to the lead PBIAS at the gate of the PMOS transistor M8 and the lead NBIAS of the NMOS transistor M5 in the inverter-based time delay unit, respectively.

The present invention has significant advantages and beneficial effects over the prior-art approaches. Specifically, it is clear from the foregoing technical scheme that the disclosed circuit uses a current generator circuit independent of the power source voltage to generate two reference voltages (all the MOSes working in a saturated state), which are connected into the upper-end PMOS transistor (i.e. M8 in the drawing) and the lower-end NMOS transistor (i.e. M5 in the drawing) of the inverter-based time delay unit, respectively, to control the charging and discharging currents of the inverters, and uses three sets of correlative compensation to secure a stable delay circuit.

DETAILED DESCRIPTION OF THE INVENTION

The specific structure and method of one preferred embodiment of the present invention are shown in FIG. 3 through FIG. 6. The design concept of the present invention is to use serially connected multi-level inverters to provide signal delay. To be specific, it controls the charging and discharging currents related to inversion of the inverters to thereby control the delay caused by the inverters in the same level. As long as the current generated by the current generator remains stable in spite of variations of temperature and power source voltage and properly compensates the impacts of such variations on the inverters, the delay caused by the inverters can remain constant, so that the delay chain constructed form multiple levels of inverters with such constant delay can provide the input signal with constant delay even if the working temperature and/or the input voltage vary. The circuit structurally comprises a current generator and a multi-level inverter-based time delay unit.

Figure 3:
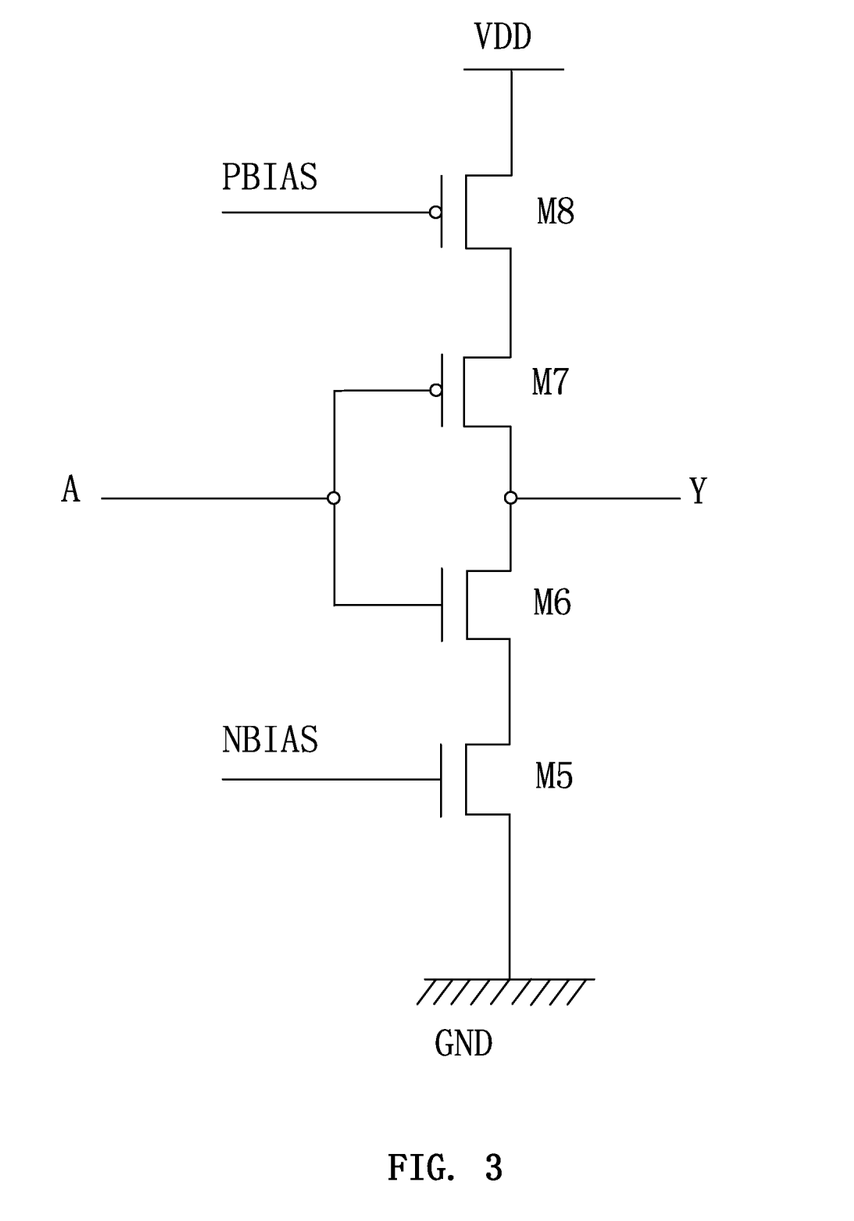
FIG. 3 is a circuit diagram of an inverter-based time delay unit according to one embodiment of the present invention.

As shown in FIG. 3, the inverter-based time delay unit comprises at least two NMOS transistors M5, M6 and at least two PMOS transistors M7, M8. Therein, a power source VDD is first input to the source of the PMOS transistor M8. In a sequence of the PMOS transistor M8, the PMOS transistor M7, the NMOS transistor M6 and then the NMOS transistor M5, the adjacent same-type transistors have their drains and sources strung together, and at last the inverter-based time delay unit is grounded through the source of the NMOS transistor M5. The gate of the PMOS transistor M8 is connected to a lead PBIAS. The gate of the PMOS transistor M7 and the gate of the NMOS transistor M6 are connected to the input A. The drain of the PMOS transistor M7 and the drain of the NMOS transistor M6 are both connected to an output Y. The gate of the NMOS transistor M5 is connected to a lead NBIAS.

The inverter used in the delay chain additionally has the PMOS transistor M8 and the NMOS transistor M5. By controlling the voltages (at the leads PBIAS and NBIAS) applied onto their gates, the working current of the inverter-based time delay unit can be adjusted. The BIAS voltage is generated by a current generator circuit. When the current in the current generator circuit is constant, the PMOS transistor M8 controlled by the lead PBIAS and the NMOS transistor M5 controlled by the lead NBIAS can make the inverter-based time delay unit behave consistently in terms of current during charging and discharging, thereby ensuring constant delay time of the inverter-based time delay unit. By connecting the voltages at the gates of the PMOS transistor M8 and the NMOS transistor M5 in the current generator circuit to the leads PBIAS and NBIAS of the inverter-based time delay unit, respectively, (with respective matching). The objective of providing a stable working current of the inverter-based time delay unit by using the current generator is so achieved.

Figure 4:
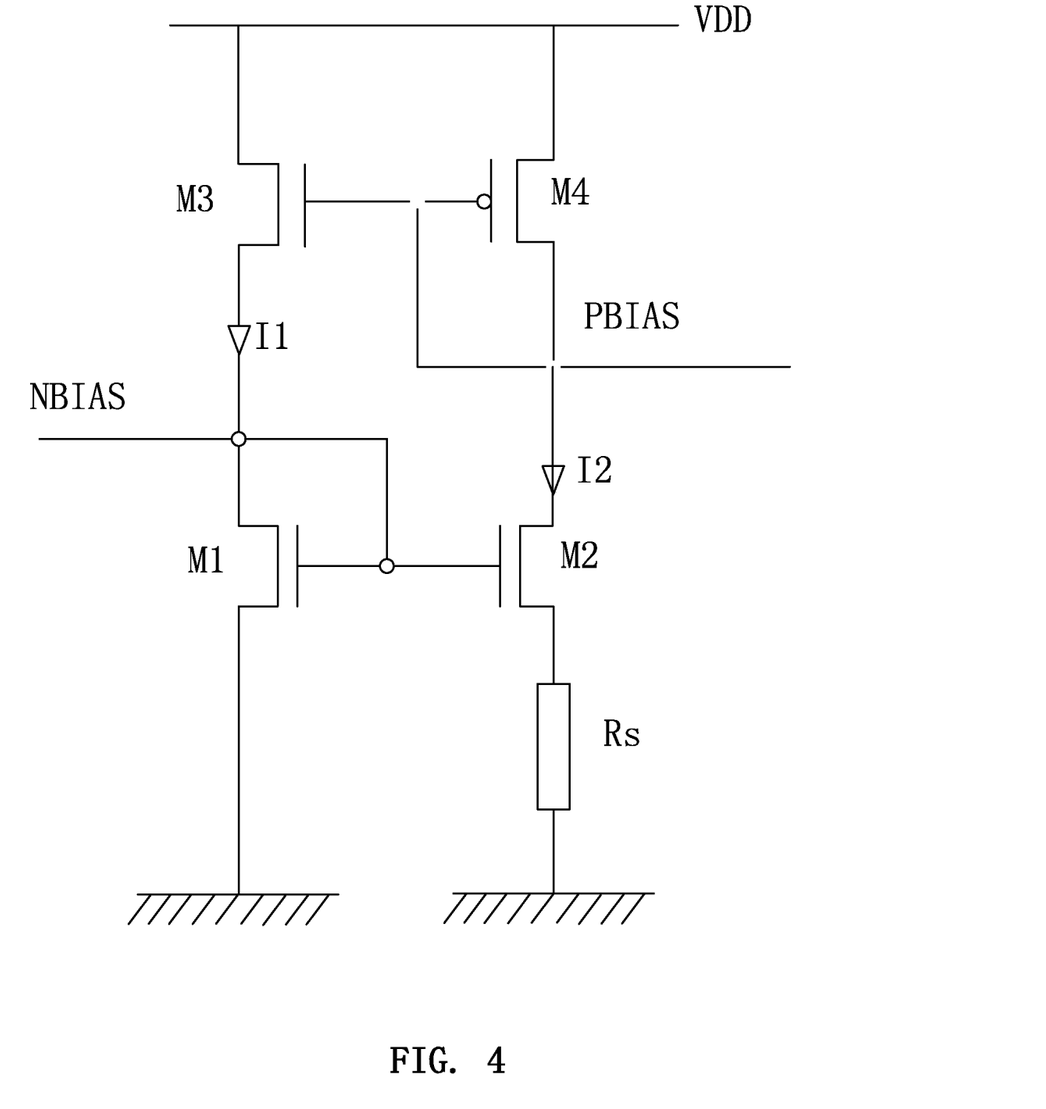
FIG. 4 is a circuit diagram of a current generator according to the embodiment of the present invention.

As shown in FIG. 4, the circuit structure of the current generator comprises at least two NMOS transistors M1, M2, at least two PMOS transistors M3, M4, and a resistor $R_S$. The power source VDD is first input to the sources of the PMOS transistors M3, M4. The gates of the PMOS transistors M3, M4 and the drain of M4 are electrically connected to act as the output of the lead PBIAS. The drains of the PMOS transistors M3, M4 are connected to the drains of the NMOS transistors M1, M2, respectively. The gates of the NMOS transistors M1 and M2 are electrically connected to the drain of the NMOS transistor M1 to act as an output of the lead NBIAS. The drain of the NMOS transistor M1 is directly grounded. The drain of the NMOS transistor M2 is connected to the resistor $R_S$, and the opposite end of the resistor $R_S$ is grounded.

The voltages at the gates of the NMOS transistors M1, M2 in the current generator are connected to the lead NBIAS of the inverter-based time delay unit and the voltages at the gates of the PMOS transistors M3, M4 are connected to the lead PBIAS of the inverter-based time delay unit.

More specifically, in the circuit structure of the current generator, there are two NMOS transistors, M1 and M2, and only two PMOS transistors, M3 and M4. The power source VDD has one node electrically connected to the source of the PMOS transistor M3. The drain of the PMOS transistor M3 is connected to the drain of the NMOS transistor M1. The source of the NMOS transistor M1 is grounded. Additionally, the power source VDD further has a node electrically connected to the source of the PMOS transistor M4. The drain of the PMOS transistor M4 is connected to the drain of the NMOS transistor M2. The drain of the NMOS transistor M2 is first connected to the resistor $R_S$, and the opposite end of the resistor $R_S$ is grounded.

The aforementioned PMOS transistors are P-channel MOS transistors and NMOS transistors are N-channel MOS transistors.

The following description will be focused on how to use a current generator to achieve current stability.

The principle of the disclosed circuit is as below.

In the foregoing circuit, $l_1=l_2=1$. Since the two transistors M3 and M4 match each other, the below relationship is established:

In the current generator circuit, the gates of the NMOS transistors M1 and M2 are connected to each other and share the same voltage, so $$V_{GS1}=V_{GS2}+IR_s; \tag{1.1}$$

It is thus calculated using the equation for the drain-to-source current of the NMOS transistor M1 in the saturation region:

$$I = \frac{\beta}{2}(V_{GS1} - V_t)^2 \Rightarrow V_{GS1} = \sqrt{\frac{2I}{\beta}} + V_t; \tag{1.2}$$

It is thus calculated using the equation for the drain-to-source current of the NMOS transistor M2 in the saturation region:

$$I = \frac{N\beta}{2}(V_{GS2} - V_t)^2 = \tag{1.3}$$

$$\frac{N\beta}{2}(V_{GS1} - IR_s - V_t)^2 \Rightarrow V_{GS1} = \sqrt{\frac{2I}{N\beta}} + IR_s + V_t;$$

From Equation (1.1) and Equation (1.3), it is obtained:

$$\sqrt{\frac{2I}{\beta}} = \sqrt{\frac{2I}{N\beta}} + IR_s \tag{1.4}$$

By further rearranging the obtained equations, the current value of the current generator circuit can be obtained:

$$I = \frac{2}{\beta R_s^2}\left(1 - \frac{1}{\sqrt{N}}\right)^2 \quad (1.5)$$

where $V_{GS1}$ is the voltage difference between the gate and the source of the NMOS M1, $V_{GS2}$ is the voltage difference between the gate and the source of the NMOS M2, $R_s$ is the resistance of the resistor in the current generator, I is the current flowing through the NMOSes M1 and M2 in the current generator circuit, $\beta$ is a parameter related to the relationship among the mobility of the charge carrier of the MOSFET, the gate oxide capacitance in a unit of area, and the aspect ratio, whose value is in negative correlation with the ambient temperature, $V_t$ is the threshold voltage of the NMOSes M1 and M2, wherein M1 and M2 match each other and thus share the same threshold voltage, and N is a parameter representing that the width of the NMOS M2 is N times of the width of the M1.

As can be deduced from the foregoing, the current generating circuit can generate a stable current independent of power source voltage while ensuring all the transistors in the current generator circuit work in the saturation region.

It is clear from the foregoing that the current generator having the disclosed structure can generate a stable current (with all the transistors working in the saturation region) that is independent of power source voltage. However, temperature is another factor that impacts practical operation of the circuit significantly. Due to temperature variations, the mobility of the charge carriers of the MOS transistors in the current generator and the resistance of the serially connected N+ resistors in the circuit are both affected. According to Equation (1.5)

$$I = \frac{2}{\beta R_s^2}\left(1 - \frac{1}{\sqrt{N}}\right)^2,$$

the value of $\beta$ and the value of resistance R both affect the size of the current in the circuit. This results in increased temperature and increased resistance of the resistors. In other words, the R value increases, so the current decreases (in direct correlation). On the other hand, the increased temperature leads to the decreased mobility of the charge carriers and in turn the decreased value of $\beta$. As can be seen in Equation (1.5), this will increase the current in the circuit (in negative correlation). In this respect, the increased temperature affects the size of the current by changing the resistance of the resistors and the mobility of the charge carriers. In this way, changing the ratio between the resistance of the resistor R and the W/L of the NMOSes, the resulting effects on $\beta$ and R can be adjusted. This minimizes the impact of the ambient temperature on the parameters $\beta$ and R, thereby minimizing the impact of the environment on the current of the circuit current, and further counteracts the impact of temperature on the size of delay, so as to balance the impact of temperature on the both and neutralize the impact of temperature variations on the current generator circuit.

Figure 5:
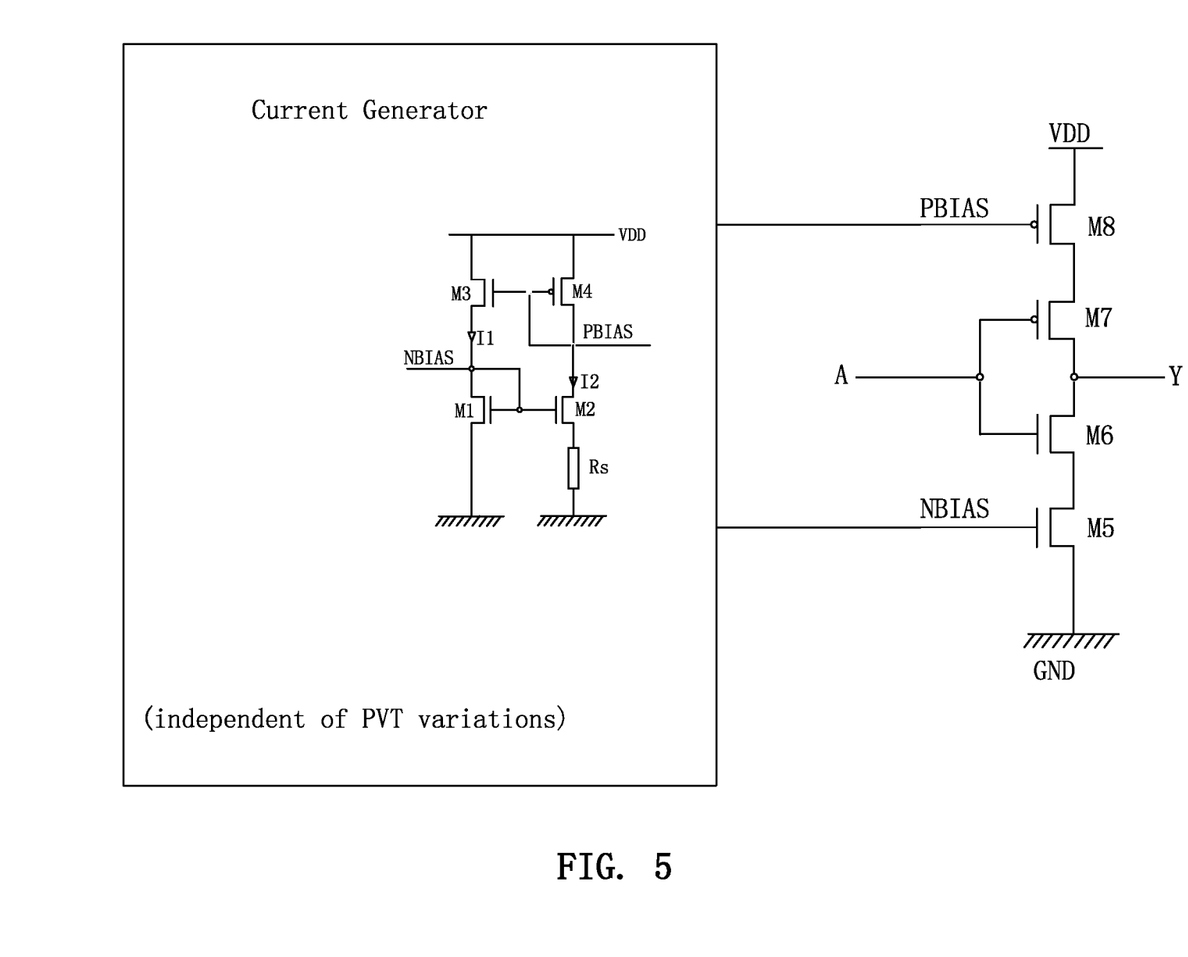
FIG. 5 is a circuit diagram of an inverter-based time delay unit as a combination of FIG. 3 and FIG. 4 that has bias voltage control.
Figure 6:
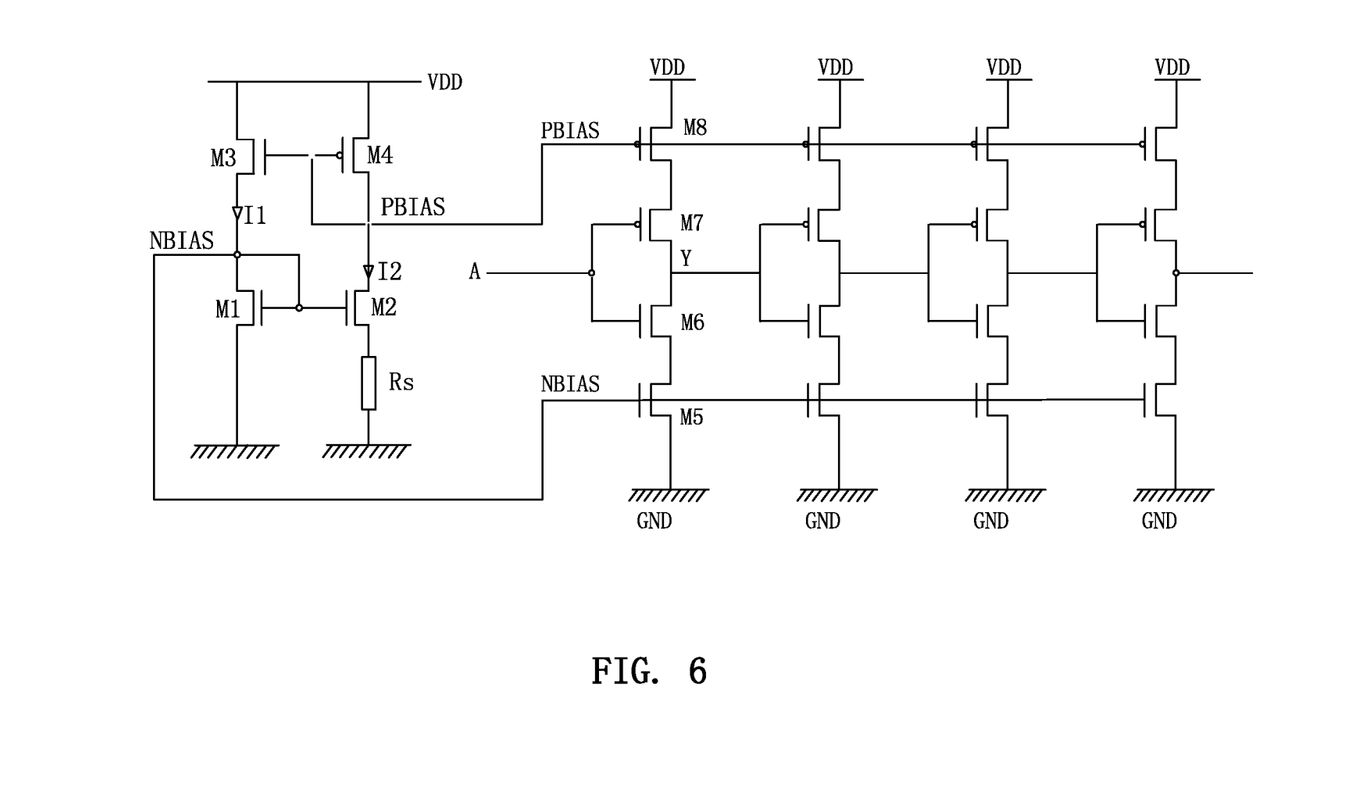
FIG. 6 is a circuit diagram of a delay chain constructed from the inverter-based time delay units using the PVT-independent current generator of the present invention.

FIG. 5 shows a level of inverters controlled by a bias voltage generated by a current generator. A real-world delay chain is composed of plural such levels of inverter-based time delay units that are connected in series. The plural levels of the inverter-based time delay units are serially connected through an input A and an output Y, as shown in FIG. 6. For an inverter unit with control MOSes, even if voltages at the leads PBIAS and NBIAS can reproduce the stable current generated in the current generator to the inverter-based time delay unit, the equivalent resistance and threshold voltages of the MOSes and in turn the size of delay will still vary with the temperature. The result is that when the temperature increases, the mobility of the charge carriers of the MOS transistors in the inverter-based time delay unit decreases, leading to increased equivalent resistance and increased delay time.

Compensation between the $\beta$ value and the resistor $R_s$ can balance the impact of the ambient temperature on the current value of the current generator. If the impact of the ambient temperature on $\beta$ is properly enhanced, when the ambient temperature increases, the current of the current generator circuit will be properly increased. Such an increased current when reflected into the inverter-based time delay unit controlled by the current generator can compensate the impact of the increased delay in the inverter-based time delay unit caused by the increased temperature. By doing so, when the ambient temperature varies, the size of delay in a delay circuit of this structure can remain constant.

When the power source voltage increases, the current generator circuit can provide a constant current, but voltage variations can change the gate voltages of the input MOSFETes M6 and M7 in the inverter-based time delay unit. When the power source voltage increases, the equivalent resistance of M6 and M7 is decreased. This tends to reduce the size of delay of the time delay unit. On the other hand, due to the increased power source voltage, the voltage inverter-based time delay unit has to reach a higher voltage level when charging and discharging. This tends to increase the size of delay of the time delay unit. Thus, by simply modulating the MOSFETes M5 and M8 controlled by the current generator to limit the current to a suitable level, the inverter-based time delay unit can be compensated in the event of power source voltage variations, thereby having stable delay.

To sum up, with the foregoing circuit structure and compensation method, the present invention provides a delay chain independent of voltage and temperature.

According to the present invention, the foregoing method can be further summarized as below:

The disclosed compensation method for a PVT-independent fixed delay circuit achieves stableness of the delay circuit through three sets of compensation:

Set 1: the $\beta$ value of the NMOS transistor M2 in the current generator and the $\beta$ value of the resistor $R_s$ are such complementary that the currents $l_1$ and $l_2$ remain stable when the working temperature increases. The current $l_2$ is calculated as $$I = \frac{2}{\beta R_s^2}\left(1 - \frac{1}{\sqrt{N}}\right)^2.$$

When the temperature increases, $\beta$ reduces so the current tends to increase, and the resistance $R_s$ increases so the current tends to reduce. The impact relationship of the two can adjust the compensation through changing the resistance $R_s$ and $\beta$ in terms of magnitude. At the same time of combination, the circuit structure nullifies the impact of the power source voltage on the current. After compensation, a current source independent of voltage and temperature is formed.

Set 2: When the temperature increases, the charge carriers in the NMOS transistor M6 and the PMOS transistor M7 connected to the input A become less mobile. As a result, when the NMOS transistor M5 and the PMOS transistor M8 provide stable currents, the size of delay caused by the inverter-based time delay unit is increased. By adjusting the values of $R_s$ and β of the first set, when the temperature increases, the current from the current generator is increased properly to compensate the increased delay caused by the reduced mobility of the charge carriers of the NMOS transistor M6 and the PMOS transistor M7 when the temperature increases.

Set 3: when the power source voltage increases, the high potential of the input A of the inverter-based time delay unit is increased. The increased gate voltage and power source voltage reduce the equivalent resistance of the turned-on NMOS transistor M6 and PMOS transistor M7. This tends to decrease the size of delay of the inverter-based time delay unit. At the same time, as the voltage increases, the voltage span for the output of the inverter-based time delay unit to turn to high from low and from low to high is increased. This tends to increase the delay time of the inverter-based time delay unit, and the two are complementary. By properly controlling the currents of the upper PMOS transistor M8 and the lower NMOS transistor M5, the complementarity between two can be optimized to nullify the impact of power source voltage variations on delay of the time delay unit, thereby providing stable delay.

With the combination of the three sets of compensation as described above, the impacts of temperature and voltage on the inverter-based time delay unit delay can be minimized, thereby securing stableness of the delay chain composed of the inverter-based time delay units.

Both of the circuit structure and the compensation method of the present invention are more advanced than the prior art.

(1) Opposite to the known method using a basic inverter cascade, the present invention uses a bias signal generated by a current generator circuit independent of ambient temperature and power source voltage to limit the current in the inverters, thereby remaining stable delay time.

(2) Opposite to U.S. Pat. No. 7,391,274 B2 that uses a bandgap reference voltage circuit to generate a fixed voltage and uses a special material resistor to generate a fixed current, the present invention uses a structurally simple current generator that is independent of voltage to generate a bias control signal that controls the currents of the inverters. From the perspective of structure, the U.S. Pat. No. 7,391,274 B2 uses a bandgap reference voltage circuit (typically consisting of MOS transistors, triodes, resistors and operational amplifiers) to generate a constant reference voltage, and uses an additional operational amplifier to reproduce the constant voltage generated by the bandgap reference voltage circuit into the current generator circuit. Then a SiAl resistor (having to maintain a constant resistor value in the event of temperature variations) is used to generate constant current value, and afterward this current generator circuit is used to generate a bias signal to control delay of the inverter-based time delay unit. Opposite to the prior patent, the present invention uses a simple current generator circuit that has two PMOSes M3 and M4, two NMOSes M1 and M2, and a resistor made of a normal material (having a temperature coefficient). The special structure of the circuit makes the current of the current generator independent of ambient temperature and working voltage. The disclosed control circuit saves the triodes, the operational amplifier circuit, and the resistor made of the special material as used in the prior patent, thereby significantly simplifying the control circuit. In terms of compensation, this design further provides modulation of the relationship between the β value of the NMOS and the resistance $R_s$ in the current generator circuit that slightly increases the current of the current generator when the ambient temperature increases. The slightly increased current of the current generator can compensate the deceleration of the transistors in the inverter-based time delay unit caused by the increased temperature. Moreover, selection of the suitable current can compensate the impact of power source voltage variations on the input transistors M6 and M7 in the inverter-based time delay unit. In this way, the control circuit of the present invention is structurally simpler than that of U.S. Pat. No. 7,391,274 B2, and the impact of the temperature and power source voltage on the inverter-based time delay unit can be further compensated, so that the entire delay circuit is more resistant to ambient temperature variations and power source voltage variations, thereby making the size of delay of the circuit more constant when the ambient temperature and/or the power source voltage change.

The circuit structure and compensation method of the present invention is significant to stability of a delay chain in a demanding digital circuit design. The delay chain may alternatively be a combination of various other circuits. For example, a ring oscillator formed using delay may be used as an internal clock source of a system. As another example, delay and a related logic circuit may be used to make a clock rate detection circuit. The stability of the clock source formed using such a ring oscillator and of the clock rate detection circuit is determined by the stability and accuracy of their delay chain design. For a clock rate detection circuit made of the delay circuits using the foregoing design method, the detection circuit uses consistent criteria in spite of ambient temperature and power source voltage. This is thus significant to detection of the clock signal rate that is imported in nature and independent of voltage and temperature.

(1) Use of sub-gate delay adjustment based on a digital locking loop: the circuit uses a delay locking loop DLL, which comprises a delay chain for delaying a clock signal; a detector for detecting phase and frequency between the clock signal and a delay clock signal (PFD); and a current generator with an adjustable bias current, for converting the phase difference and frequency difference between the foregoing two into a control voltage that is fed back to control the delay magnitude of the delay signal. The basic concept is using a PFD to detect the phase and frequency relationship between the two clock signals and converting the differences into a voltage control signal to correct the delay relationship between the two clock signals, thereby providing dynamic adjustment. Therefore, the present invention is different from the traditional designs in terms of means, control circuit and objective.

(2) A digital information sequencer and a delay modulator: the objective of the disclosed design is to provide a method and circuit for fully digitalized delay without any analog circuit control. Instead, the present invention uses digital command control codes to modulate and correct delay time. By using competent devices, delay variations of delay elements caused by variations of process, temperature and power source during delay control can be identified, so that corresponding digital command correction codes can be generated to modulate and correct the controlled delay. The present invention further provides a method using digital command control codes to modulate and correct the controlled delay. Without any analog circuit, the disclosed method is different from the conventional designs in the art.

What is claimed is:

1. A PVT-independent fixed delay circuit, comprising a current generator and an inverter-based time delay unit, the inverter-based time delay unit comprising a plurality of inverter units, wherein each inverter unit comprises at least two NMOS transistors M5, M6 and at least two PMOS transistors M7, M8; a power source VDD is first input to a source of the PMOS transistor M8, in a sequence of the PMOS transistor M8, the PMOS transistor M7, the NMOS transistor M6 and then the NMOS transistor M5, with drains and sources of the adjacent same-type transistors strung together, and at last is grounded through the source of the NMOS transistor M5, in which a gate of the PMOS transistor M8 is connected to a lead PBIAS; a gate of the PMOS transistor M7 and a gate of the NMOS transistor M6 are connected to each other to act as an input A; the drain of the PMOS transistor M7 and the drain of the NMOS transistor M6 are both connected to an output Y; a gate of the NMOS transistor M5 is connected to a lead NBIAS; and the plurality of inverter units are cascaded by series-connecting the leads PBIAS of the inverter units together, series-connecting the leads NBIAS of the inverter units together, and connecting the output Y of a previous inverter unit to the input A of a next inverter unit; and the current generator having a circuit structure including at least two NMOS transistors M1, M2, at least two PMOS transistors M3, M4 and a resistor $R_S$, wherein the power source VDD is first input to sources of the PMOS transistors M3, M4, gates of the PMOS transistor M3, M4 and a drain of the M4 electrically connected together to act as an output of the lead PBIAS, drains of the PMOS transistors M3, M4 being connected to drains of the NMOS transistors M1, M2, respectively, gates of the NMOS transistors M1, M2 and the drain of the M1 being electrically connected together to act as an output of the lead NBIAS, a source of the NMOS transistor M1 being directly grounded, a source of the NMOS transistor M2 being connected to the resistor $R_S$, and then an opposite end of the resistor $R_S$ being grounded;

wherein, the outputs of the leads PBIAS and NBIAS in the current generator are connected to the lead PBIAS and the lead NBIAS of a first inverter unit in the inverter-based time delay unit, respectively; the output Y of a last inverter unit functions as the PVT-independent fixed delay circuit's output; and the input A of the first inverter unit functions as the PVT-independent fixed delay circuit's input.

2. The PVT-independent fixed delay circuit of claim 1, wherein in the circuit structure of the current generator, the power source VDD has a node electrically connected to the source of the PMOS transistor M3, and the drain of the PMOS transistor M3 is connected to the drain of the NMOS transistor M1, while the source of the NMOS transistor M1 is grounded; the power source VDD further having a node electrically connected to the source of the PMOS transistor M4, the drain of the PMOS transistor M4 being connected to the drain of the NMOS transistor M2, the source of the NMOS transistor M2 being first connected to the resistor $R_S$ and then the opposite end of the resistor $R_S$ being grounded; the gates of the PMOS transistors M3, M4 and the drain of the PMOS transistor M4 being connected to provide the inverter-based time delay unit with a voltage at the lead PBIAS, the drains of the NMOS transistors M1, M2 and the drain of the NMOS transistor M1 being connected to provide the inverter-based time delay unit with a voltage at the lead NBIAS.

3. The PVT-independent fixed delay circuit of claim 1, wherein the PMOS transistor is a P-channel MOS transistor and the NMOS transistor is an N-channel MOS transistor.

* * * * *